US012795993B2

(12) United States Patent
Zheng et al.

(10) Patent No.: US 12,795,993 B2
(45) Date of Patent: Nov. 10, 2026

(54) THIN FILM TRANSISTORS WITH L-SHAPED LIGHT-SHIELDING PATTERNS AND ARRAY SUBSTRATES

(71) Applicant: Shenzhen China Star Optoelectronics Semiconductor Display Technology Co., Ltd., Shenzhen (CN)

(72) Inventors: Shuai Zheng, Shenzhen (CN); Zhenguo Lin, Shenzhen (CN); Zhiwei Song, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 291 days.

(21) Appl. No.: 18/498,053

(22) Filed: Oct. 31, 2023

(65) Prior Publication Data

US 2024/0186419 A1 Jun. 6, 2024

(30) Foreign Application Priority Data

Dec. 5, 2022 (CN) ......................... 202211548237.4

(51) Int. Cl.
*H10D 30/67* (2025.01)
*H10D 86/40* (2025.01)
(Continued)

(52) U.S. Cl.
CPC ..... *H10D 30/6723* (2025.01); *H10D 30/6755* (2025.01); *H10D 86/423* (2025.01);
(Continued)

(58) Field of Classification Search
CPC ............... H10D 30/6723; H10D 86/60; H10D 30/6755; H10D 86/423; H10K 59/1213; H10K 59/126
See application file for complete search history.

(56) References Cited

U.S. PATENT DOCUMENTS

| | | | | |
|---|---|---|---|---|
| 11,257,888 B2 * | 2/2022 | Cai | .................... | H10D 30/6723 |
| 2016/0254276 A1 * | 9/2016 | Tada | .................. | H10D 30/6723 257/72 |

(Continued)

FOREIGN PATENT DOCUMENTS

| | | |
|---|---|---|
| CN | 109920856 A | 6/2019 |
| JP | 2022090230 A | 6/2022 |

OTHER PUBLICATIONS

Chinese Office Action issued in corresponding Chinese Patent Application No. 202211548237.4 dated Jul. 8, 2026, pp. 1-7.

*Primary Examiner* — Norman D Richards
*Assistant Examiner* — Sean Ayers Winters
(74) *Attorney, Agent, or Firm* — PV IP PC; Peter Stecher; Wei Te Chung

(57) ABSTRACT

A thin film transistor and an array substrate, including a light-shielding layer and an active layer. The light-shielding layer includes a first light-shielding pattern, a second light-shielding pattern and a third light-shielding pattern. The active layer includes a channel area, a first conductive area and a second conductive area located on both sides of the channel area. An orthogonal projection of the first light-shielding pattern on the substrate at least covers an orthogonal projection of the channel area on the substrate. An orthographic projection of the second light-shielding pattern on the substrate overlaps at least a part of an orthographic projection of the first conductive area on the substrate. An orthographic projection of the third light-shielding pattern
(Continued)

on the substrate overlaps at least a part of an orthographic projection of the second conductive area on the substrate.

20 Claims, 4 Drawing Sheets

(51) Int. Cl.
*H10D 86/60* (2025.01)
*H10K 59/121* (2023.01)
*H10K 59/126* (2023.01)

(52) U.S. Cl.
CPC ......... *H10D 86/60* (2025.01); *H10K 59/1213* (2023.02); *H10K 59/126* (2023.02)

(56) References Cited

U.S. PATENT DOCUMENTS

2017/0317155 A1* 11/2017 Oh .......................... H10D 86/60
2018/0314105 A1* 11/2018 Shu ................... G02F 1/133512
2020/0105789 A1* 4/2020 Fang ..................... G03F 7/2024
2020/0335524 A1* 10/2020 Lee ........................ H10D 86/60

* cited by examiner

THIN FILM TRANSISTORS WITH L-SHAPED LIGHT-SHIELDING PATTERNS AND ARRAY SUBSTRATES

CROSS-REFERENCE TO RELATED APPLICATION

This disclosure claims priority to and the benefit of Chinese Patent Application No. 202211548237.4, filed on Dec. 5, 2022, the disclosure of which is incorporated herein by reference in its entirety.

TECHNICAL FIELD

The present disclosure relates to display technologies, and in particular to thin film transistors and array substrates.

BACKGROUND

Thin film transistors (TFTs) using oxide semiconductors, such as indium gallium zinc oxide (IGZO), have become an excellent candidate for organic light-emitting diode (OLED) process due to their high field-effect mobility and good uniformity. Compared to amorphous silicon (a-Si) materials, IGZO has lower leakage current and higher electron mobility. In order to improve the stability and saturation characteristics of IGZO TFTs, a light-shielding layer (LS) is usually disposed below the IGZO channel. IGZO is a semiconductor material, and the parts outside the channel need to be subjected to conductor treatment. After dry etching of the gate insulating layer (GI), any gas such as ammonia ($NH_3$), hydrogen ($H_2$), and helium (He) is used to conductively treat the IGZO active layer not covered by the GI, thereby connecting the IGZO active layer to the source/drain.

However, due to the fact that IGZO traces may climb the LS slope, the conductive treatment of IGZO and the dry etching treatment of GI are processed in the same chamber, and the dry etching has anisotropic characteristics of fast longitudinal etching and slow lateral etching, when thickness of the LS is thick (above 6500 Å) or the taper is steep (above 60°), IGZO above the LS climbing position is prone to insufficient conductive treatment, and even GI residue, resulting in high resistance of the conductive IGZO, reducing the on-state current (Ion reduction), which leads to higher power consumption and lower screen brightness. In addition, when the LS boundary is close to the gate boundary (within 4 μm), IGZO and GI above the LS climbing position are easily blocked by photoresist (PR), and it is difficult for the etching and conductive treatment at the corners, resulting in increased resistance of IGZO.

In summary, the existing OLED array substrates based on IGZO TFT have problem of high resistance and Ion reduction due to insufficient conductive treatment of the active layer. Therefore, it is necessary to provide a thin film transistor and an array substrate to improve the problem.

SUMMARY

The embodiments of the present disclosure provide a thin film transistor which includes a substrate, a light-shielding layer and an active layer. The light-shielding layer is disposed on the substrate. The light-shielding layer includes a first light-shielding pattern, a second light-shielding pattern connected to the first light-shielding pattern, and a third light-shielding pattern connected to the first light-shielding pattern. The active layer is disposed on the light-shielding layer. The active layer includes a channel area, a first conductive area and a second conductive area located on both sides of the channel area. An orthogonal projection of the first light-shielding pattern on the substrate at least covers an orthogonal projection of the channel area on the substrate. An orthographic projection of the second light-shielding pattern on the substrate overlaps at least a part of an orthographic projection of the first conductive area on the substrate. An orthographic projection of the third light-shielding pattern on the substrate overlaps at least a part of an orthographic projection of the second conductive area on the substrate.

The embodiments of the present disclosure further provide other thin film transistor which includes a substrate, a light-shielding layer, an active layer, and a source and a drain. The light-shielding layer is disposed on the substrate. The light-shielding layer includes a first light-shielding pattern, a second light-shielding pattern connected to the first light-shielding pattern, and a third light-shielding pattern connected to the first light-shielding pattern. The active layer is disposed on the light-shielding layer. The active layer includes a channel area, a first conductive area and a second conductive area located on both sides of the channel area. The source and drain are disposed on the active layer and are connected to the first conductive area and the second conductive area respectively. An orthogonal projection of the first light-shielding pattern on the substrate at least covers an orthogonal projection of the channel area on the substrate. An orthographic projection of the second light-shielding pattern on the substrate overlaps at least a part of an orthographic projection of the first conductive area on the substrate. An orthographic projection of the third light-shielding pattern on the substrate overlaps at least a part of an orthographic projection of the second conductive area on the substrate.

The embodiments of the present disclosure further provide an array substrate, including the thin film transistor described in any of the above embodiments.

BRIEF DESCRIPTION OF THE DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

DETAILED DESCRIPTION

The following description of every embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to orientations of the accompanying drawings. Therefore, the used directional terms are intended to illustrate, but not to limit, the present disclosure. In the accompanying drawings, units with similar structures are indicated by a same number.

The embodiments of the present disclosure provide a thin film transistor and an array substrate to improve the problem of high IGZO resistance and Ion reduction caused by insufficient conductive treatment of the IGZO active layer, thereby reducing power consumption and improving screen brightness.

The present disclosure is further explained in conjunction with the accompanying drawings and specific embodiments.

Figure 1:
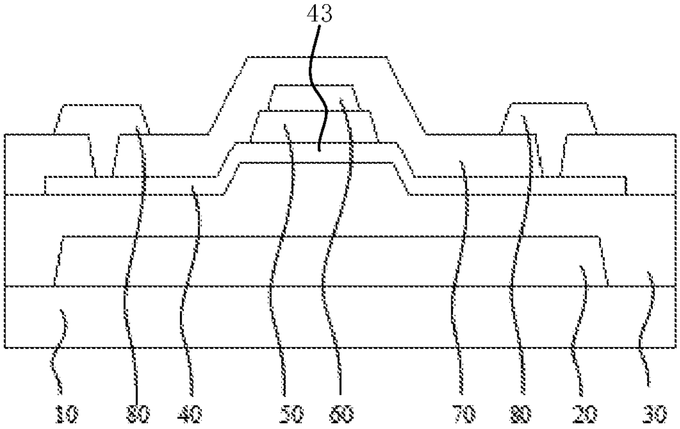
FIG. 1 is a structural schematic diagram of a thin film transistor provided by embodiments of the present disclosure.

FIG. 1 is a structural schematic diagram of a thin film transistor (TFT) provided by embodiments of the present disclosure. The thin film transistor includes a substrate 10, a light-shielding layer 20, a buffer layer 30, an active layer 40, a gate insulation layer 50, a gate 60, an interlayer insulation layer 70, and a source and a drain 80. The light-shielding layer 20 is located on the substrate 10. The buffer layer 30 is located on a surface of the light-shielding layer 20 away from the substrate 10. The active layer 40 is located on the light-shielding layer 20. The buffer layer 30 is located between the active layer 40 and the light-shielding layer 20. The gate insulation layer 50 is located on a surface of the active layer 40 away from the substrate 10. The gate 60 is located on a surface of the gate insulation layer 50 away from the substrate. The interlayer insulation layer 70 is located on the active layer 40, and a plurality of first contact holes 81 are defined in the interlayer insulation layer 70. The source and drain 80 is located on a surface of the interlayer insulation layer 70 away from the substrate 10, and the source and drain 80 is electrically connected to the active layer 40 through the first contact hole 81.

Figure 2:
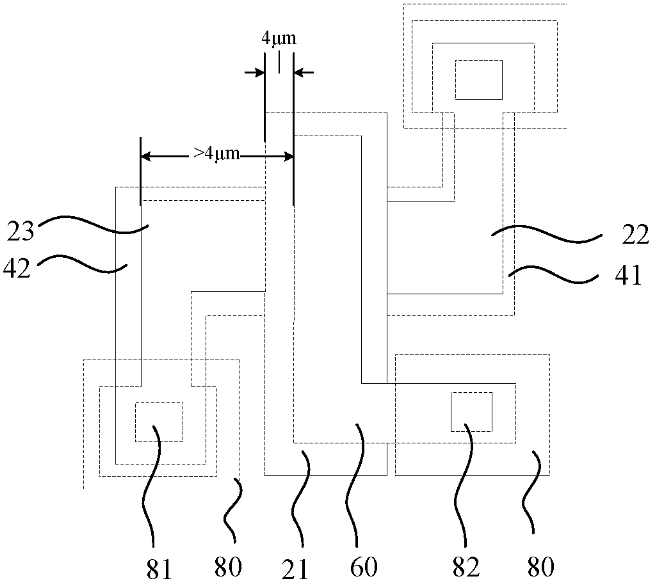
FIG. 2 is a first structural schematic diagram of a conductive area and a light-shielding layer of the thin film transistor provided by embodiments of the present disclosure.

As shown in FIG. 2, in one embodiment of the present disclosure, a material of the active layer 40 is indium gallium zinc oxide (IGZO). The active layer 40 includes a channel area 43 and conductive areas located on both sides of the channel area 43, and are defined as a first conductive area 41 and a second conductive area 42, respectively. The gate insulation layer 50 corresponding to the channel area 43 is disposed on the active layer 40. The gate 60 is insulated with the active layer 40 through the gate insulation layer 50. The gate 60 is electrically connected to the source and drain 80 through a second contact hole 82. An orthogonal projection of the channel area 43 on the substrate 10 is rectangular. The orthogonal projection of the gate 60 on the substrate 10 is L-shaped. A shape of the first conductive area 41 and a shape of the second conductive area 42 are symmetrically centered relative to the center of the channel area 43. Both the orthogonal projections of the first and second conductive areas 41 and 42 on the substrate 10 is L-shaped, and the first and second conductive areas 41 and 42 are connected through the channel area 43, forming a right angle Z-shaped orthogonal projection on the substrate 10.

The light-shielding layer 20 of the TFT provided by the embodiments of present disclosure includes a first light-shielding pattern 21, a second light-shielding pattern 22 connected to the first light-shielding pattern 21, and a third light-shielding pattern 23 connected to the first light-shielding pattern 21. The first light-shielding pattern 21 is located below the channel area 43, and its orthographic projection on the substrate 10 at least covers the orthographic projection of the channel area 43 on the substrate 10. By the shading effect of the first light-shielding pattern 21, the light stability is improved, thereby improving the stability and saturation characteristics of the thin film transistor. The second light-shielding pattern 22 is located below the first conductive area 41, and the orthographic projection of the second light-shielding pattern 22 on the substrate 10 overlaps at least a part of the orthographic projection of the first conductive area 41 on the substrate 10. The third light-shielding pattern 23 is located below the second conductive area 42, and the orthographic projection of the third light-shielding pattern 23 on the substrate 10 overlaps at least a part of the orthographic projection of the second conductive area 42 on the substrate 10.

Figure 3:
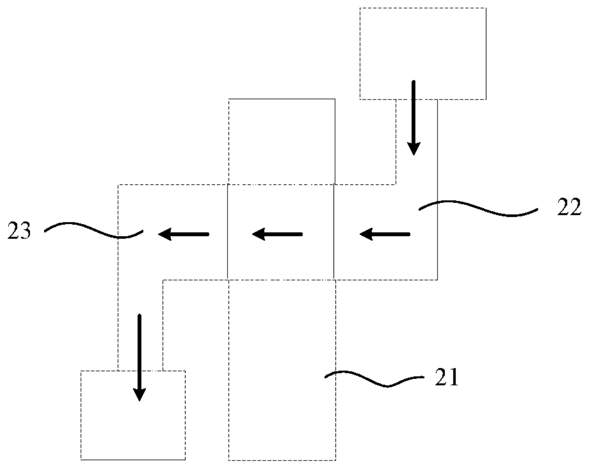
FIG. 3 is a structural schematic diagram of the light-shielding layer of the thin film transistor shown in FIG. 2 provided by embodiments of the present disclosure.

In some embodiments, the light-shielding layer 20 extends to an area corresponding to the source and drain 80. Specifically, as shown in FIG. 2, along an extension direction of the conductive areas, a second light-shielding pattern 22 is located below the first conductive area 41, and a third light-shielding pattern 23 is located below the second conductive area 42. The orthogonal projection of the conductive areas on the substrate 10 covers the orthogonal projections of the second light-shielding pattern 22 and the third light-shielding pattern 23 on the substrate 10. By making the conductive area of the active layer 40 larger than the area of the light-shielding layer 20, the parasitic capacitance of the overlapping part between the light-shielding layer 20 and the active layer 40 can be reduced. From a planar perspective, both the second light-shielding pattern 22 and the third light-shielding pattern 23 are L-shaped, and the second light-shielding pattern 22 and the third light-shielding pattern 23 are connected through the first light-shielding pattern 21, forming a right angle Z-shaped pattern, as shown in FIGS. 2 to 3.

It should be noted that a part of the second light-shielding pattern 22 and a part of the third light-shielding pattern 23 located directly below the source and drain 80 may be covered by the orthographic projections of the conductive areas directly below the source and drain 80 on the substrate 10. Or as shown in FIG. 2, the part of the second light-shielding pattern 22 and the part of the third light-shielding pattern 23 located directly below the source and drain 80 covers the orthographic projections of the conductive areas directly below the source and drain 80 on the substrate 10.

By disposing the second light-shielding pattern 22 and the third light-shielding pattern 23 below the conductive active layer 40 and extending them to the area corresponding to the source and drain 80, the light-shielding layer 20 may still achieve connection between the source and drain 80 at a larger taper angle (60°≤taper≤90°) and a higher film thickness (thickness of the light-shielding layer (LS)≥6500 Å). Specifically, as shown in FIG. 3, the current flows in a right angle Z-shape along an extension direction of the light-shielding layer 20 below the conductive areas. Furthermore, disposing the light-shielding layer 20 below the conductive active layer 40 can flatten the terrain of the active layer 40 in a current flow direction as shown in FIG. 3, thereby reducing resistance.

Figure 4:
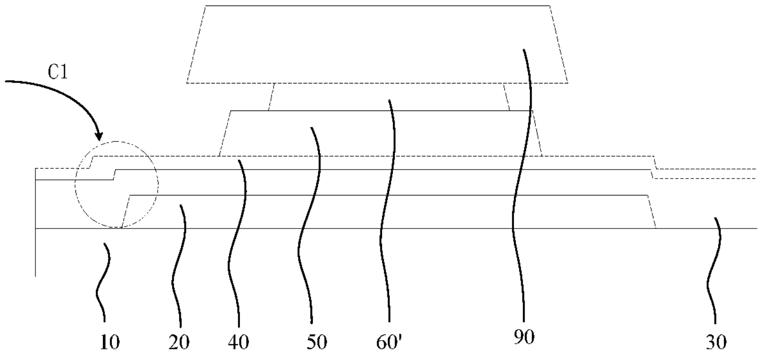
FIG. 4 is a structural schematic diagram of the thin film transistor in the manufacturing process provided by embodiments of the present disclosure.

In combination with FIGS. 2 and 4, in the embodiment, due to the increase in the area of the light-shielding layer 20, the light-shielding layer 20 may extend to the conductive areas on both sides of the channel area 43, thereby increasing the distance between the boundary of the light-shielding layer 20 and the boundary of the gate 60, making the distance greater than 4 μm. Thus, in the thin film transistor manufacturing process, the light-shielding layer 20 corresponding to the climbing position C1 on the active layer 40 may not be blocked by the photoresist (PR) film layer 90 during lithography process for the metal layer 60', enabling it to undergo conductive processing, thereby reducing the resistance and the on-state current (Ion) of the active layer 40. In addition, the embodiment may increase the process margin to increase the taper angle of the light-shielding layer 20 to over 60°, and increase the film thickness to 6500 Å.

It should be noted that the reduction of the resistance and Ion of the active layer 40 is achieved by extending the light-shielding layer 20 to the area corresponding to the conductive areas. As for the shape and size of the light-shielding pattern of the light-shielding layer 20 below the conductive areas, and whether the edge of the light-shielding layer 20 exceeds the edge of the conductive areas, it can be adjusted based on the parasitic capacitance of the overlapping part between the light-shielding layer 20 and the active layer 40 that can be carried in the actual TFT design. Optionally, when the area of the active layer 40 is fixed and the light-shielding layer 20 extends below the conductive areas, the parasitic capacitance is reduced by reducing the area of the light-shielding layer 20.

Figure 5:
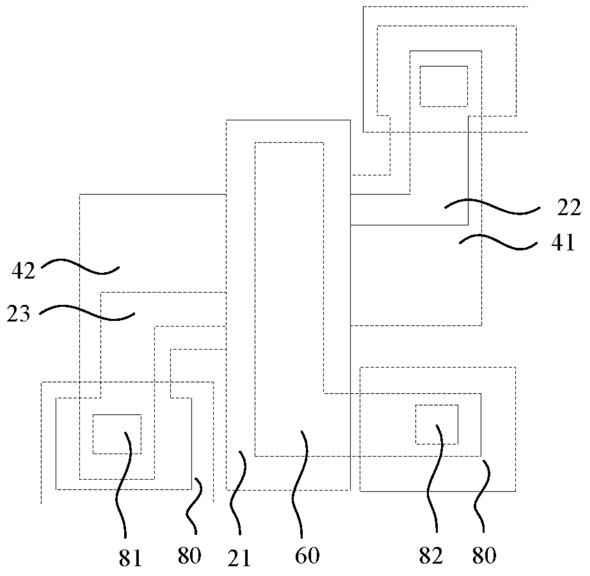
FIG. 5 is a second structural schematic diagram of the conductive area and the light-shielding layer of the thin film transistor provided by embodiments of the present disclosure.

In one embodiment, as shown in FIG. 5, in the extension direction of the conductive areas, the second light-shielding pattern 22 is disposed in a staggered manner with the first conductive area 41, and the third light-shielding pattern 23 is disposed in a staggered manner with the second conductive area 42. The orthogonal projections of the conductive areas on the substrate 10 does not fully cover the orthogonal projections of the second light-shielding pattern 22 and the third light-shielding pattern 23 on the substrate 10. From a planar perspective, both the second light-shielding pattern 22 and the third light-shielding pattern 23 are L-shaped. The inner edges of the L-shaped second light-shielding pattern 22 and the third light-shielding pattern 23 extend beyond the inner edges of the L-shaped first conductive area 41 and the second conductive area 42, correspondingly. The outer edges of the L-shaped second light-shielding pattern 22 and the third light-shielding pattern 23 are completely covered by the outer edges of the L-shaped first conductive area 41 and the second conductive area 42, correspondingly. The area of the second light-shielding pattern 22 is smaller than the area of the first conductive area 41, and the area of the third light-shielding pattern 23 is smaller than the area of the second conductive area 42, to reduce the parasitic capacitance of the overlapping part between the light-shielding layer 20 and the active layer 40. The second light-shielding pattern 22 is connected to the third light-shielding pattern 23 through the first light-shielding pattern 21, and forms a multi-stepped pattern, as shown in FIG. 6.

Figure 6:
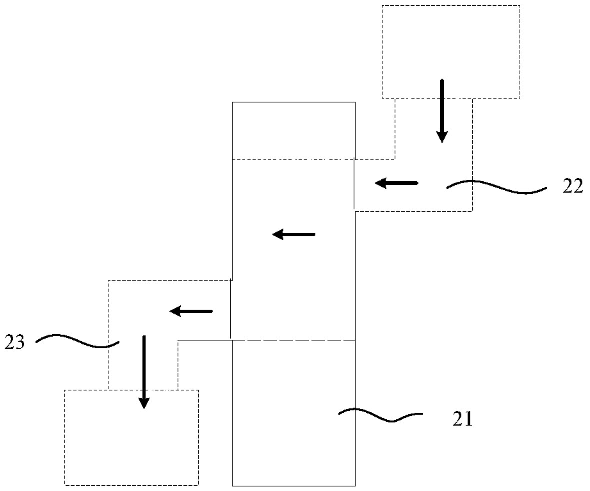
FIG. 6 is a structural schematic diagram of the light-shielding layer of the thin film transistor shown in FIG. 5 provided by embodiments of the present disclosure.

As shown in FIGS. 5 to 6, in the embodiment, the second light-shielding pattern 22 and the third light-shielding pattern 23 extend to the area corresponding to the source and drain 80, and the current flows in a multi-stepped manner along the extension direction of the light-shielding layer 20 below the conductor areas. Similar or identical to the embodiment shown in FIG. 3, by disposing the light-shielding layer 20 below the conductive active layer 40, the terrain of the active layer 40 in the current flow direction can be flattened, thereby reducing resistance.

In addition, the embodiment can also increase the process margin, increase the taper of the light-shielding layer 20 to over 60°, and increase the LS film thickness to over 6500 Å, thereby improving the refresh rate and reducing power consumption.

Figure 7:
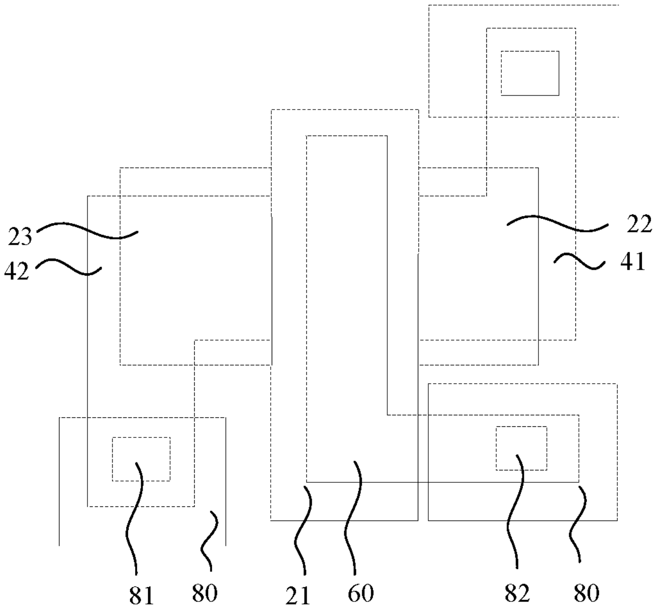
FIG. 7 is a third structural schematic diagram of the conductive area and the light-shielding layer of the thin film transistor provided by embodiments of the present disclosure.
Figure 8:
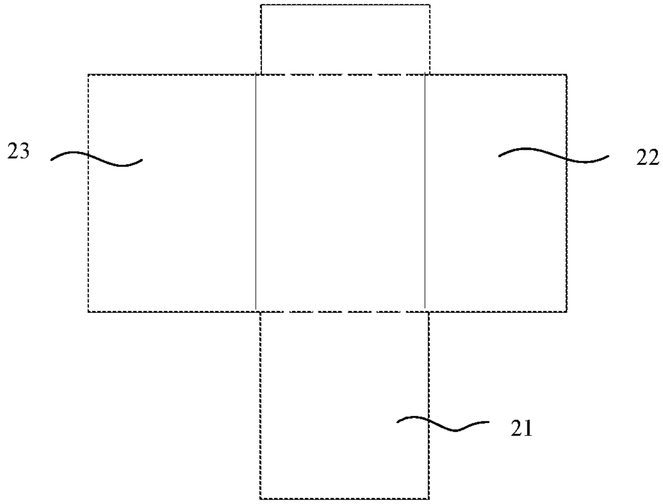
FIG. 8 is a structural diagram of the light-shielding layer of the thin film transistor shown in FIG. 7 provided by embodiments of the present disclosure.

In some embodiments, light-shielding patterns are only disposed corresponding to parts of the conductive areas extending horizontally. Specifically, as shown in FIGS. 7 to 8, the orthographic projection of the second light-shielding pattern 22 on the substrate 10 covers a part of the orthographic projection of the first conductive area 41 extending horizontally on the substrate 10. The orthographic projection of the third light-shielding pattern 23 on the substrate 10 covers a part of the orthographic projection of the second conductive area 42 extending horizontally on the substrate 10. The second light-shielding pattern 22 is connected to the third light-shielding pattern 23 through the first light-shielding pattern 21, and forms at least one rectangular pattern. In the horizontal direction, the edge of the second light-shielding pattern 22 away from the first light-shielding pattern 21 is located within the edge of the first conductive area 41 away from the channel area 43, and the edge of the third light-shielding pattern 23 away from the first light-shielding pattern 21 is located within the edge of the second conductive area 42 away from the channel area 43. In the vertical direction, the width of the second light-shielding pattern 22 and the third light-shielding pattern 23 are greater than the width of the first conductive area 41 and the second conductive area 42 respectively.

Due to the fact that in the embodiment, the outer edge of the shading layer 20 may cause the active layer 40 to experience climbing phenomenon, in order to ensure sufficient conductive treatment, it is necessary to set the taper of the light-shielding layer 20 to be ≤60°, and the thickness of the light-shielding layer 20 to be ≤6500 Å.

It should be noted that in order to reduce the parasitic capacitance of the overlapping part between the light-shielding layer 20 and the active layer 40, the area of the light-shielding layer 20 in the embodiment of FIG. 7 may be reduced. For example, the first conductive area 41 and the second conductive area 42 extending horizontally may fully cover the first light-shielding pattern 21 and the second light-shielding pattern 22. Or the second light-shielding pattern 22 may be connected to the third light-shielding pattern 23 through the first light-shielding pattern 21, and form a right angle Z-shaped pattern, as long as the orthographic projection of the second light-shielding pattern 22 on the substrate 10 overlaps at least a part of the orthographic projection of the first conductive area 41 extending horizontally on the substrate 10, and the orthographic projection of the third light-shielding pattern 23 on the substrate 10 overlaps at least a part of the orthographic projection of the second conductive area 42 extending horizontally on the substrate 10.

The embodiment of present disclosure further provides an array substrate, including the thin film transistor as described above.

Beneficial effects of the embodiments of the present disclosure are as follows. The embodiments of the present disclosure provide the thin film transistor and the array substrate. The thin film transistor includes the light-shielding layer and the active layer. The light-shielding layer includes the first light-shielding pattern and the second light-shielding pattern. The active layer is located on the light-shielding layer and includes the channel area and the conductive areas located on both sides of the channel area, defined as the first conductive area and the second conductive area. The orthographic projection of the first light-shielding pattern on the substrate covers the orthographic projection of the channel area on the substrate. The orthogonal projection of the second light-shielding pattern on the substrate overlaps at least a part of the orthogonal projection of the first conductive area on the substrate. The orthogonal projection of the third light-shielding pattern on the substrate overlaps at least a part of the orthogonal projection of the second conductive area on the substrate. By increasing the area of the light-shielding layer and extending it to the area corresponding to the conductive areas of the active layer, the corners of IGZO and GI corresponding to the climbing position of the light-shielding layer are not easily blocked by photoresist (PR) and can undergo etching process and conductive processing, thereby improving the problem of high IGZO resistance and reduced Ion caused by insufficient conductive treatment of the IGZO active layer, thereby reducing power consumption and improving screen brightness.

In the above embodiments, the descriptions of each embodiment have their own emphasis. For parts that are not detailed in one embodiment, please refer to the relevant descriptions of other embodiments.

In summary, although the preferred embodiments disclosed in present disclosure are not intended to limit the present disclosure, ordinary technical personnel in the art can make various modifications and embellishments within the spirit and scope of the present disclosure. Therefore, the scope of protection of the present disclosure is based on the scope defined by the claims.

What is claimed is:

1. A thin film transistor, comprising:

a substrate;

a light-shielding layer disposed on the substrate, comprising a first light-shielding pattern, a second light-shielding pattern connected to the first light-shielding pattern, and a third light-shielding pattern connected to the first light-shielding pattern, wherein both the second light-shielding pattern and the third light-shielding pattern are L-shaped;

an active layer disposed on the light-shielding layer, comprising a channel area, a first conductive area and a second conductive area located on both sides of the channel area; and a gate disposed on the active layer;

wherein an orthogonal projection of the first light-shielding pattern on the substrate at least covers an orthogonal projection of the channel area on the substrate;

an orthographic projection of the second light-shielding pattern on the substrate overlaps at least a part of an orthographic projection of the first conductive area on the substrate; and an orthographic projection of the third light-shielding pattern on the substrate overlaps at least a part of an orthographic projection of the second conductive area on the substrate.

2. The thin film transistor of claim 1, wherein orthographic projections of the first conductive area and the second conductive area on the substrate are both L-shaped, the first conductive area and the second conductive area are connected through the channel area, forming a right angle Z-shaped orthogonal projection on the substrate.

3. A thin film transistor, comprising:

a substrate;

a light-shielding layer disposed on the substrate, comprising a first light-shielding pattern, a second light-shielding pattern connected to the first light-shielding pattern, and a third light-shielding pattern connected to the first light-shielding pattern, wherein both the second light-shielding pattern and the third light-shielding pattern are L-shaped;

an active layer disposed on the light-shielding layer, comprising a channel area, a first conductive area and a second conductive area located on both sides of the channel area;

a gate disposed on the active layer;

an interlayer insulation layer disposed on the gate; and a source and a drain disposed on interlayer insulation layer, connected to the first conductive area and the second conductive area respectively;

wherein an orthogonal projection of the first light-shielding pattern on the substrate at least covers an orthogonal projection of the channel area on the substrate;

an orthographic projection of the second light-shielding pattern on the substrate overlaps at least a part of an orthographic projection of the first conductive area on the substrate; and an orthographic projection of the third light-shielding pattern on the substrate overlaps at least a part of an orthographic projection of the second conductive area on the substrate.

4. The thin film transistor of claim 3, wherein orthographic projections of the first conductive area and the second conductive area on the substrate are both L-shaped, the first conductive area and the second conductive area are connected through the channel area, forming a right angle Z-shaped orthogonal projection on the substrate.

5. The thin film transistor of claim 3, wherein the light-shielding layer extends to an area corresponding to the source and the drain.

6. The thin film transistor of claim 5, wherein the orthographic projections of the first conductive area and the second conductive area on the substrate cover the orthographic projections of the second light-shielding pattern and the third light-shielding pattern on the substrate.

7. The thin film transistor of claim 6, wherein the second light-shielding pattern and the third light-shielding pattern are connected through the first light-shielding pattern to form a right angle Z-shaped pattern.

8. The thin film transistor of claim 5, wherein the second light-shielding pattern is disposed in a staggered manner with the first conductive area in an extension direction of the first conductive area, and the third light-shielding pattern is disposed in a staggered manner with the second conductive area in an extension direction of the second conductive area; and the orthographic projection of the first conductive area on the substrate does not fully cover the orthographic projection of the second light-shielding pattern on the substrate; and/or, the orthographic projection of the second conductive area on the substrate does not fully cover the orthographic projection of the third light-shielding pattern on the substrate.

9. The thin film transistor of claim 8, wherein the second light-shielding pattern and the third light-shielding pattern are connected through the first light-shielding pattern to form a multi-stepped pattern.

10. The thin film transistor of claim 3, wherein the orthographic projection of the second light-shielding pattern on the substrate overlaps at least a part of an orthographic projection of the first conductive area extending horizontally on the substrate, and the orthographic projection of the third light-shielding pattern on the substrate overlaps at least a part of an orthographic projection of the second conductive area extending horizontally on the substrate.

11. The thin film transistor of claim 10, wherein the second light-shielding pattern and the third light-shielding pattern at least form one rectangular pattern.

12. An array substrate, wherein the array substrate comprises a thin film transistor, and the thin film transistor comprises:

a substrate;

a light-shielding layer disposed on the substrate, comprising a first light-shielding pattern, a second light-shielding pattern connected to the first light-shielding pattern, and a third light-shielding pattern connected to the first light-shielding pattern, wherein both the second light-shielding pattern and the third light-shielding pattern are L-shaped;

an active layer disposed on the light-shielding layer, comprising a channel area, a first conductive area and a second conductive area located on both sides of the channel area;

a gate disposed on the active layer;

an interlayer insulation layer disposed on the gate; and a source and a drain disposed on interlayer insulation layer, connected to the first conductive area and the second conductive area respectively;

wherein an orthogonal projection of the first light-shielding pattern on the substrate at least covers an orthogonal projection of the channel area on the substrate;

an orthographic projection of the second light-shielding pattern on the substrate overlaps at least a part of an orthographic projection of the first conductive area on the substrate; and an orthographic projection of the third light-shielding pattern on the substrate overlaps at least a part of an orthographic projection of the second conductive area on the substrate.

13. The array substrate of claim 12, wherein orthographic projections of the first conductive area and the second conductive area on the substrate are both L-shaped, the first conductive area and the second conductive area are connected through the channel area, forming a right angle Z-shaped orthogonal projection on the substrate.

14. The array substrate of claim 12, wherein the light-shielding layer extends to an area corresponding to the source and the drain.

15. The array substrate of claim 14, wherein the orthographic projections of the first conductive area and the second conductive area on the substrate cover the orthographic projections of the second light-shielding pattern and the third light-shielding pattern on the substrate.

16. The array substrate of claim 15, wherein the second light-shielding pattern and the third light-shielding pattern are connected through the first light-shielding pattern to together form a right angle Z-shaped pattern.

17. The array substrate of claim 14, wherein the second light-shielding pattern is disposed in a staggered manner with the first conductive area in an extension direction of the first conductive area, and the third light-shielding pattern is disposed in a staggered manner with the second conductive area in an extension direction of the second conductive area; and the orthographic projection of the first conductive area on the substrate does not fully cover the orthographic projection of the second light-shielding pattern on the substrate; and/or, the orthographic projection of the second conductive area on the substrate does not fully cover the orthographic projection of the third light-shielding pattern on the substrate.

18. The array substrate of claim 17, wherein the second light-shielding pattern and the third light-shielding pattern are connected through the first light-shielding pattern to together form a multi-stepped pattern.

19. The array substrate of claim 14, wherein the orthographic projection of the second light-shielding pattern on the substrate overlaps at least a part of an orthographic projection of the first conductive area extending horizontally on the substrate, and the orthographic projection of the third light-shielding pattern on the substrate overlaps at least a part of an orthographic projection of the second conductive area extending horizontally on the substrate.

20. The array substrate of claim 19, wherein the second light-shielding pattern and the third light-shielding pattern at least form one rectangular pattern.

* * * * *